United States Patent
Teraki et al.

(10) Patent No.: US 7,612,448 B2
(45) Date of Patent: Nov. 3, 2009

(54) POWER MODULE HAVING A COOLING DEVICE AND SEMICONDUCTOR DEVICES MOUNTED ON A RESIN SUBSTRATE, METHOD OF PRODUCING SAME, AND AIR CONDITIONER

(75) Inventors: Junichi Teraki, Kusatsu (JP); Mitsuhiro Tanaka, Kusatsu (JP)

(73) Assignee: Daikin Industries, Ltd., Osaka (JP)

( * ) Notice: Subject to any disclaimer, the term of this patent is extended or adjusted under 35 U.S.C. 154(b) by 69 days.

(21) Appl. No.: 11/791,844

(22) PCT Filed: Dec. 1, 2005

(86) PCT No.: PCT/JP2005/022061

§ 371 (c)(1),
(2), (4) Date: May 30, 2007

(87) PCT Pub. No.: WO2006/064666

PCT Pub. Date: Jun. 22, 2006

(65) Prior Publication Data

US 2008/0111151 A1 May 15, 2008

(30) Foreign Application Priority Data

Dec. 13, 2004 (JP) ............................. 2004-359665
Apr. 6, 2005 (JP) ............................. 2005-109720

(51) Int. Cl.
*H01L 31/111* (2006.01)
*H01L 25/07* (2006.01)
*H01L 25/16* (2006.01)
*H05K 1/02* (2006.01)
*H05K 7/14* (2006.01)
*H05K 7/20* (2006.01)

(52) U.S. Cl. .............................. 257/713; 257/E23.051; 257/E23.098; 257/E23.105; 257/E23.016; 257/E25.03; 257/675; 257/177; 257/714; 257/712; 257/717; 257/720; 257/668; 257/685; 257/529; 257/532; 438/122

(58) Field of Classification Search ................ 257/713, 257/177, 714, 712, 717, 720, 675, 668, 685, 257/529, 532, 723, 784, 786, 704, 710, 711, 257/E23.051, E23.098, E23.105, E25.016, 257/E25.03; 438/122
See application file for complete search history.

(56) References Cited

U.S. PATENT DOCUMENTS

| 5,421,909 | A | * | 6/1995 | Ishikawa et al. | ............ 136/256 |
| 5,703,399 | A | | 12/1997 | Majumdar et al. | |
| 5,805,249 | A | * | 9/1998 | Hasegawa et al. | ............. 349/59 |
| 6,486,548 | B1 | * | 11/2002 | Nakatsu et al. | ............. 257/690 |

(Continued)

FOREIGN PATENT DOCUMENTS

JP 63-45899 A 2/1988

(Continued)

*Primary Examiner*—Alexander O Williams
(74) *Attorney, Agent, or Firm*—Global IP Counselors, LLP

(57) ABSTRACT

A power module includes a power semiconductor, a non-power semiconductor, one resin substrate, and a cooling device. The power semiconductor and the non-power semiconductor configure a power supply circuit for performing power conversion. Both the power semiconductor and the non-power semiconductor are mounted on the resin substrate. The cooling device is disposed in order to cool the power semiconductor.

20 Claims, 11 Drawing Sheets

U.S. PATENT DOCUMENTS

| | | | |
|---|---|---|---|
| 6,666,082 B2 * | 12/2003 | Watanabe et al. | 73/204.22 |
| 2001/0023983 A1 * | 9/2001 | Kobayashi et al. | 257/698 |
| 2003/0201530 A1 * | 10/2003 | Kurihara et al. | 257/712 |
| 2005/0117312 A1 * | 6/2005 | Kimura et al. | 361/746 |
| 2005/0147839 A1 * | 7/2005 | Suwa et al. | 428/624 |
| 2006/0108601 A1 * | 5/2006 | Okamoto | 257/177 |
| 2007/0159864 A1 * | 7/2007 | Yoshizaki et al. | 363/89 |

FOREIGN PATENT DOCUMENTS

| | | |
|---|---|---|
| JP | 02-308558 A | 12/1990 |
| JP | 04-93159 U | 8/1992 |
| JP | 05-218296 A | 8/1993 |
| JP | 08-148646 A | 6/1996 |
| JP | 09-092762 A | 4/1997 |
| JP | 09-139461 A | 5/1997 |
| JP | 11-003966 A | 1/1999 |
| JP | 2000-252406 A | 9/2000 |
| JP | 2001-036004 A | 2/2001 |
| JP | 2002-093974 A | 3/2002 |
| JP | 2002-134687 A | 5/2002 |
| JP | 2002-353405 A | 12/2002 |
| JP | 2003-018861 A | 1/2003 |
| JP | 2004-028403 A | 1/2004 |
| JP | 2004-111619 A | 4/2004 |
| JP | 2004-336929 A | 11/2004 |

* cited by examiner

| | ORDINARY MOUNTING SUBSTRATE | MOUNTING SUBSTRATE PERTAINING TO PRESENT INVENTION | | | |
|---|---|---|---|---|---|
| THICKNESS (μm) OF INSULATION LAYER | 1600 | 300 | 200 | 100 | |
| THERMAL RESISTANCE (K/W) | 13.3 | 2.5 | 1.7 | 0.83 | |
| COOLING MEMBER TEMPERATURE (°C) | 100 | 100 | 50 | 100 | 50 | 100 | 50 |
| JUNCTION TEMPERATURE (°C) | 632 | 582 | 200 | 150 | 168 | 118 | 133 | 83 |

(HEAT EMISSION AMOUNT: 40 W, HEAT EMISSION AREA: 4 cm²)

Fig. 4

POWER MODULE HAVING A COOLING DEVICE AND SEMICONDUCTOR DEVICES MOUNTED ON A RESIN SUBSTRATE, METHOD OF PRODUCING SAME, AND AIR CONDITIONER

CROSS-REFERENCE TO RELATED APPLICATIONS

This U.S. National stage application claims priority under 35 U.S.C. § 119(a) to Japanese Patent Application Nos. 2004-359665, filed in Japan on Dec. 13, 2004, and 2005-109720, filed in Japan on Apr. 6, 2005, the entire contents of which are hereby incorporated herein by reference.

TECHNICAL FIELD

The present invention relates to a power module that performs power conversion and to a method of producing the same. The present invention also relates to an air conditioner in which the power module is installed.

BACKGROUND ART

Typically, a power module is primarily configured by a power semiconductor mounting substrate on which is mounted a chip such as a power semiconductor whose heat emission is relatively large, a non-power semiconductor mounting substrate on which is mounted an IC chip such as a microcomputer whose heat emission is relatively small, and a cooling unit (e.g., a heat dissipating fin, etc.) for cooling primarily the power semiconductor (e.g., see JP-A No. 2004-111619).

SUMMARY OF THE INVENTION

Problem to be Solved by the Invention

Incidentally, ordinarily a mounting substrate made of aluminium or a ceramic whose thermal conductivity is high is employed as the power semiconductor mounting substrate because it is necessary to release the large amount of heat arising from the power semiconductor to the outside. On the other hand, a mounting substrate made of a resin such as glass fiber reinforced epoxy resin is employed as the non-power semiconductor mounting substrate because a semiconductor whose heat emission amount is large like the power semiconductor is not mounted thereon. Ordinarily, a mounting substrate made of aluminium or a ceramic is more expensive than a mounting substrate made of a resin, and this is a large factor that leads to an increase in the cost of the power module. Further, separating and mounting the power semiconductor and the non-power semiconductor on two types of mounting substrates leads to an increase in labor costs and equipment costs during production of the power module.

It is an object of the present invention to provide a power module whose production cost can be kept low.

Means to Solve the Problem

A power module pertaining to a first aspect of the present invention comprises a power semiconductor, a non-power semiconductor, one resin substrate, and cooling means. The "power semiconductor" referred to here is, for example, a diode, a power transistor, and the like. Further, the "non-power semiconductor" referred to here is, for example, a microcomputer, a ROM (read-only memory), and the like. Further, the "resin substrate" referred to here is, for example, a substrate produced by only a resin, a substrate produced by a fiber reinforced plastic, or a substrate produced from a resin in which powder or the like is dispersed and at least on one side or the inside of which a circuit pattern is formed. Incidentally, among these resin substrates, a two-sided resin substrate on both sides of which a circuit pattern is formed or a laminate resin substrate comprising plural circuits laminated alternately with insulation layers (resin layers) in a board thickness direction are particularly preferable. The power semiconductor and the non-power semiconductor configure a power supply circuit for performing power conversion. Both the power semiconductor and the non-power semiconductor are mounted on the resin substrate. The cooling means is disposed in order to cool the power semiconductor.

In a power module of the type that uses a heat dissipating fin to discharge heat arising from a power semiconductor, ordinarily the heat arising from the power semiconductor is discharged to the outside of the power module as a result of wind at air temperature or a temperature several tens of Celsius degrees higher being supplied to the heat dissipating fin. When such a heat dissipating method is employed, a substrate whose thermal conductivity is high, such as an aluminium substrate or a ceramic substrate, is needed in the power module as the substrate on which the power semiconductor is mounted in order to ensure sufficient heat dissipation.

However, when a cooling medium (which may be a gas or a liquid) whose temperature is lower than ordinary, for example, is utilized in the cooling means of the power module pertaining to the present invention, the heat arising from the power semiconductor can be sufficiently discharged from the power module even when a resin substrate whose thermal conductivity is low is utilized as the mounting substrate of the power semiconductor. Of course, it is necessary for the temperature of the cooling medium in this case to be appropriately changed depending on the amount of heat arising from the power semiconductor and the thickness of the resin substrate. Under this assumption, in this power module, it becomes possible to mount the power semiconductor and the non-power semiconductor on one resin substrate. Consequently, in this power module, it is not necessary to employ an expensive aluminium substrate or ceramic substrate as the substrate on which the power semiconductor is mounted. As a result, the raw material cost of the substrate, the labor cost, and the equipment cost can be reduced in the production of this power module. For this reason, this power module can be produced at a low production cost.

A power module pertaining to a second aspect of the present invention is the power module pertaining to the first aspect of the present invention, wherein the cooling means is a cooling fluid passage. A cooling fluid is passed through this cooling fluid passage. The "cooling fluid" referred to here is a fluid for cooling the power semiconductor and includes air, a gas, water or a liquid (e.g., a refrigerant enclosed in a refrigerant circuit of a refrigeration device), for example. Additionally, the cooling fluid passage is disposed on the opposite side of a mounting surface of the resin substrate on which the power semiconductor and the non-power semiconductor are mounted. The "mounting surface" referred to here may have a step.

In this power module, the heat arising from the power semiconductor is discharged to the outside of the power module by the cooling fluid flowing in the cooling fluid passage. Consequently, in this power module, as long as the cooling fluid is maintained at an appropriate temperature, the heat arising from the power semiconductor can be sufficiently discharged from the power module even when a resin substrate whose thermal conductivity is low is employed as the mounting substrate of the power semiconductor. Further, when this power module is installed in an air conditioner, the refrigerant flowing through the refrigerant circuit can be utilized as the cooling fluid, which is economical.

A power module pertaining to a third aspect of the present invention is the power module pertaining to the second aspect of the present invention, wherein the cooling fluid passage is disposed inside the resin substrate.

In this power module, the cooling fluid passage is disposed inside the resin substrate. For this reason, in this power module, the distance between the cooling fluid passage and the power semiconductor can be shortened. Consequently, in this power module, the heat arising from the power semiconductor can be discharged to the outside of the power module even more efficiently.

A power module pertaining to a fourth aspect of the present invention is the power module pertaining to the second or the third aspect of the present invention and further comprises temperature detecting means and temperature controlling means. The temperature detecting means detects the temperature of the power semiconductor or the vicinity thereof. The temperature controlling means controls the temperature of the cooling fluid such that the temperature detected by the temperature detecting means becomes a predetermined temperature.

In this power module, the temperature detecting means detects the temperature of the power semiconductor or the vicinity thereof. Additionally, the temperature controlling means controls the temperature of the cooling fluid such that the temperature detected by the temperature detecting means becomes a predetermined temperature. For this reason, in this power module, the temperature of the cooling fluid can be appropriately maintained.

A power module pertaining to a fifth aspect of the present invention is the power module pertaining to any of the second to the fourth aspects of the present invention, wherein the shortest distance between the power semiconductor and the cooling fluid passage is shorter than the shortest distance between the non-power semiconductor and the cooling fluid passage.

In this power module, the shortest distance between the power semiconductor and the cooling fluid passage is shorter than the shortest distance between the non-power semiconductor and the cooling fluid passage. For this reason, in this power module, the heat arising from the power semiconductor can be discharged to the outside of the power module more efficiently than the heat arising from the non-power semiconductor.

A power module pertaining to a sixth aspect of the present invention is the power module pertaining to any of the first to the fifth aspects of the present invention, wherein the thickness of the portion of the resin substrate on which the power semiconductor is mounted is thinner than the thickness of the portion of the resin substrate on which the non-power semiconductor is mounted.

In this power module, the thickness of the portion of the resin substrate on which the power semiconductor is mounted is thinner than the thickness of the portion of the resin substrate on which the non-power semiconductor is mounted. For this reason, in this power module, the power semiconductor is closer to the cooling fluid passage in comparison to the non-power semiconductor. Consequently, in this power module, the heat arising from the power semiconductor can be discharged to the outside of the power module more efficiently than the heat arising from the non-power semiconductor. Further, because the non-power semiconductor is disposed on a different level than the power semiconductor, it becomes difficult for the non-power semiconductor to be affected by the heat arising from the power semiconductor.

A power module pertaining to a seventh aspect of the present invention is the power module pertaining to the fifth or the sixth aspects of the present invention, wherein the resin substrate is configured by plural laminate units laminated in a board thickness direction. Further, the thickness of the portion on which the power semiconductor is mounted and the thickness of the portion on which the non-power semiconductor is mounted are adjusted depending on the shapes of the laminate units.

In this power module, the resin substrate is configured by plural laminate units laminated in a board thickness direction. Further, the thickness of the portion on which the power semiconductor is mounted and the thickness of the portion on which the non-power semiconductor is mounted are adjusted depending on the shapes of the laminate units. For this reason, in this power module, a resin substrate with a complex shape can be produced without performing complex machining.

A power module pertaining to an eighth aspect of the present invention is the power module pertaining to any of the first to the seventh aspects of the present invention and further comprises a heat diffusing portion. The heat diffusing portion is for diffusing heat arising from at least the power semiconductor. The "heat diffusing portion" referred to here is, for example, a heat spreader, a thermal through hole, a thermally conductive filler, a thermally conductive sheet and the like.

In this power module, a heat diffusing portion is further comprised. For this reason, in this power module, the heat arising from the power semiconductor can be discharged to the outside of the power module even more efficiently.

A power module pertaining to a ninth aspect of the present invention is the power module pertaining to the eighth aspect of the present invention and further comprises an electrical insulation layer. The electrical insulation layer is disposed between the heat diffusing portion and the cooling fluid passage. The "electrical insulation layer" referred to here may be an electrical insulation sheet, an adhesive, or part of a resin layer of a multilayer resin substrate.

In this power module, the electrical insulation layer is disposed between the heat diffusing portion and the cooling fluid passage. For this reason, in this power module, electrical discharge can be effectively prevented.

A power module pertaining to a tenth aspect of the present invention is the power module pertaining to the eighth or the ninth aspect of the present invention, wherein a heat spreader is included in the heat diffusing portion. The heat spreader is disposed between the power semiconductor and the mounting surface of the resin substrate.

In this power module, the heat spreader is disposed between the power semiconductor and the mounting surface of the resin substrate. For this reason, in this power module, the heat arising from the power semiconductor can be processed efficiently.

A power module pertaining to an eleventh aspect of the present invention is the power module pertaining to any of the eighth to the tenth aspects of the present invention, wherein a thermal through hole is included in the heat diffusing portion. The thermal through hole is disposed inside the resin substrate along a direction intersecting the board surface of the resin substrate. Further, it is preferable for the thermal through hole to be disposed in a direction orthogonal to the board surface of the resin substrate.

In this power module, the thermal through hole is disposed inside the resin substrate along a direction intersecting the board surface of the resin substrate. For this reason, in this power module, the thermal conductivity of the inside of the resin substrate can be raised. Consequently, in this power module, the heat arising from the power semiconductor can be discharged to the outside of the power module even more efficiently.

A power module pertaining to a twelfth aspect of the present invention is the power module pertaining to any of the eighth to the eleventh aspects of the present invention, wherein a thermally conductive filler is included in the heat diffusing portion. The thermally conductive filler is dispersed and mixed in with the resin portion of the resin substrate. The "thermally conductive filler" referred to here is ceramic powder or the like having an insulating property, for example.

In this power module, the thermally conductive filler is dispersed and mixed in with the resin portion of the resin substrate. For this reason, the thermal conductivity of the inside of the resin substrate can be raised. Consequently, in this power module, the heat arising from the power semiconductor can be discharged to the outside of the power module even more efficiently.

A power module pertaining to a thirteenth aspect of the present invention is the power module pertaining to any of the fourth to the eighth aspects of the present invention, wherein a thermally conductive sheet is included in the heat diffusing portion. The thermally conductive sheet is embedded in the resin portion of the resin substrate. The "thermally conductive sheet" referred to here is a ceramic plate or the like having an insulating property, for example.

In this power module, the thermally conductive sheet is embedded in the resin portion of the resin substrate. For this reason, in this power module, the thermal conductivity of the inside of the resin substrate can be raised. Consequently, in this power module, the heat arising from the power semiconductor can be discharged to the outside of the power module even more efficiently.

A power module pertaining to a fourteenth aspect of the present invention comprises a power semiconductor, a non-power semiconductor, one mounting substrate, and cooling means. The "power semiconductor" referred to here is, for example, a diode, a power transistor, and the like. Further, the "non-power semiconductor" referred to here is, for example, a microcomputer, a ROM (read-only memory), and the like. Further, the "mounting substrate" referred to here is, for example, a substrate produced by only a resin, a substrate produced by a fiber reinforced plastic, or a substrate produced from a resin in which powder or the like is dispersed and at least on one side or the inside of which a circuit pattern is formed. Incidentally, among these resin substrates, a two-sided resin substrate on both sides of which a circuit pattern is formed or a laminate resin substrate comprising plural circuits laminated alternately with insulation layers (resin layers) in a board thickness direction are particularly preferable. The power semiconductor and the non-power semiconductor configure a power supply circuit for performing power conversion. Both the power semiconductor and the non-power semiconductor are mounted on the mounting substrate. The thermal conductivity of the mounting substrate in a board thickness direction is 10 W/(m·K) or less. The cooling means is disposed in order to cool the power semiconductor. p In a power module of the type that uses a heat dissipating fin to discharge heat arising from a power semiconductor, ordinarily the heat arising from the power semiconductor is discharged to the outside of the power module as a result of wind at air temperature or a temperature several tens of Celsius degrees higher being supplied to the heat dissipating fin. When such a heat dissipating method is employed, a substrate whose thermal conductivity is high, such as an aluminium substrate or a ceramic substrate, is needed in the power module as the substrate on which the power semiconductor is mounted in order to ensure sufficient heat dissipation.

However, when a cooling medium (which may be a gas or a liquid) whose temperature is lower than ordinary, for example, is utilized in the cooling means of the power module pertaining to the present invention, the heat arising from the power semiconductor can be sufficiently discharged from the power module even when a mounting substrate whose thermal conductivity is low and 10 W/(m·K) or less is utilized as the mounting substrate of the power semiconductor. Of course, it is necessary for the temperature of the cooling medium in this case to be appropriately changed depending on the amount of heat arising from the power semiconductor and the thickness of the mounting substrate. Under this assumption, in this power module, it becomes possible to mount the power semiconductor and the non-power semiconductor on one mounting substrate whose thermal conductivity is low. Ordinarily, a mounting substrate whose thermal conductivity is low and 10 W/(m·K) or less is produced from a resin, a fiber reinforced plastic or the like, and inexpensive ones plentifully exist in comparison to aluminium substrates and ceramic substrates. Consequently, the raw material cost of the substrate, the labor cost, and the equipment cost can be reduced in the production of this power module. For this reason, this power module can be produced at a low production cost.

An air conditioner pertaining to a fifteenth aspect of the present invention comprises a refrigerant circuit and a power module. The power module includes a power semiconductor, a non-power semiconductor, one resin substrate, and a refrigerant passage. The power semiconductor and the non-power semiconductor configure a power supply circuit for performing power conversion. Both the power semiconductor and the non-power semiconductor are mounted on the resin substrate. The refrigerant passage is a passage for allowing refrigerant flowing in the refrigerant circuit to pass therethrough and is disposed on the opposite side of a mounting surface of the resin substrate on which the power semiconductor and the non-power semiconductor are mounted.

Ordinarily, a power module of the type that uses a heat dissipating fin to discharge heat arising from a power semiconductor is employed in an air conditioner, and in this power module, typically the heat arising from the power semiconductor is discharged to the outside of the power module as a result of wind at air temperature or a temperature several tens of Celsius degrees higher being supplied to the heat dissipating fin. When such a heat dissipating method is employed, a substrate whose thermal conductivity is high, such as an aluminium substrate or a ceramic substrate, is needed in the power module as the substrate on which the power semiconductor is mounted in order to ensure sufficient heat dissipation.

However, in the refrigerant circuit of an air conditioner, there are places where the refrigerant temperature is sufficiently low, and as long as the refrigerant can be allowed to flow through the refrigerant passage of the power module, the heat arising from the power semiconductor can be sufficiently discharged from the power module even when a resin substrate whose thermal conductivity is low is utilized as the mounting substrate of the power semiconductor. Of course, the temperature of the cooling medium in this case is dependent on the amount of heat arising from the power semiconductor and the thickness of the resin substrate. Under this assumption, in the power module of this air conditioner, it becomes possible to mount the power semiconductor and the non-power semiconductor on one resin substrate. Consequently, in the power module of this air conditioner, it is not necessary to employ an expensive aluminium substrate or ceramic substrate as the substrate on which the power semiconductor is mounted. As a result, the raw material cost of the substrate, the labor cost, and the equipment cost can be reduced in the production of this power module. For this reason, this power module can be produced at a low production cost. Therefore, the production cost of the air conditioner can also be reduced.

A method of producing a power module pertaining to a sixteenth aspect of the present invention is a method of producing a power module including a power semiconductor and a non-power semiconductor that configure a power supply circuit for performing power conversion, one resin substrate on which both the power semiconductor and the non-power semiconductor are mounted, and cooling means for cooling the power semiconductor, the method comprising: a power semiconductor fixing step; a wire connecting step, a non-power semiconductor connecting step; and a cooling means fixing step. In the power semiconductor fixing step, the power semiconductor is fixed to a prescribed position on the resin substrate. In the wire connecting step, the power semiconductor and a circuit disposed on the resin substrate are wire-connected. In the non-power semiconductor connecting step, the non-power semiconductor and the circuit are connected. In this non-power semiconductor connecting step, it is preferable for a reflow method to be employed. In the cooling means fixing step, the resin substrate is fixed to the cooling means. It will be noted that the power semiconductor fixing step, the wire connecting step, the non-power semiconductor connecting step, and the cooling means fixing step may be appropriately switched around.

In this power module producing method, the power semiconductor is fixed to a prescribed position on the resin substrate in the power semiconductor fixing step. Further, in the wire connecting step, the power semiconductor and the circuit disposed on the resin substrate are wire-connected. Further, in the non-power semiconductor connecting step, the non-power semiconductor and the circuit are connected. Further, in the cooling means fixing step, the resin substrate is fixed to the cooling means. For this reason, in this power module producing method, the power semiconductor and the non-power semiconductor are mounted on one resin substrate. Consequently, by utilizing this power module producing method, the raw material cost of the substrate, the labor cost, and the equipment cost can be reduced.

EFFECT OF THE INVENTION

The power module pertaining to the first aspect of the present invention can be produced at a low production cost.

In the power module pertaining to the second aspect of the present invention, as long as the cooling fluid can be maintained at an appropriate temperature, the heat arising from the power semiconductor can be sufficiently discharged from the power module even when a resin substrate whose thermal conductivity is low is employed as the mounting substrate of the power semiconductor.

In the power module pertaining to the third aspect of the present invention, the distance between the cooling fluid passage and the power semiconductor can be shortened. Consequently, in this power module, the heat arising from the power semiconductor can be discharged to the outside of the power module even more efficiently.

In the power module pertaining to the fourth aspect of the present invention, the temperature of the cooling fluid can be appropriately maintained.

In the power module pertaining to the fifth aspect of the present invention, the heat arising from the power semiconductor can be discharged to the outside of the power module more efficiently than the heat arising from the non-power semiconductor.

In the power module pertaining to the sixth aspect of the present invention, the heat arising from the power semiconductor can be discharged to the outside of the power module more efficiently than the heat arising from the non-power semiconductor. Further, because the non-power semiconductor is disposed on a different level than the power semiconductor, it becomes difficult for the non-power semiconductor to be affected by the heat from the power semiconductor.

In the power module pertaining to the seventh aspect of the present invention, a resin substrate with a complex shape can be produced without performing complex machining.

In the power module pertaining to the eighth aspect of the present invention, the heat arising from the power semiconductor can be discharged to the outside of the power module even more efficiently.

In the power module pertaining to the ninth aspect of the present invention, electrical discharge can be effectively prevented.

In the power module pertaining to the tenth aspect of the present invention, the heat arising from the power semiconductor can be processed efficiently.

In the power module pertaining to the eleventh aspect of the present invention, the thermal conductivity of the inside of the resin substrate can be raised. Consequently, in this power module, the heat arising from the power semiconductor can be discharged to the outside of the power module even more efficiently.

In the power module pertaining to the twelfth aspect of the present invention, the thermal conductivity of the inside of the resin substrate can be raised. Consequently, in this power module, the heat arising from the power semiconductor can be discharged to the outside of the power module even more efficiently.

In the power module pertaining to the thirteenth aspect of the present invention, the thermal conductivity of the inside of the resin substrate can be raised. Consequently, in this power module, the heat arising from the power semiconductor can be discharged to the outside of the power module even more efficiently.

The power module pertaining to the fourteenth aspect of the present invention can be produced at a low production cost.

The air conditioner pertaining to the fifteenth aspect of the present invention can be produced at a low production cost.

In the power module producing method pertaining to the sixteenth aspect of the present invention, the power semiconductor and the non-power semiconductor are mounted on one resin substrate. Consequently, by utilizing this power module producing method, the raw material cost of the substrate, the labor cost, and the equipment cost can be reduced.

BRIEF DESCRIPTION OF THE DRAWINGS

FIG. 4 is a chart showing the relationship between thicknesses and thermal discharge characteristics of mounting substrates pertaining to the present embodiment.

DETAILED DESCRIPTION OF THE INVENTION

<Overall Configuration of Air Conditioner>

Figure 1:
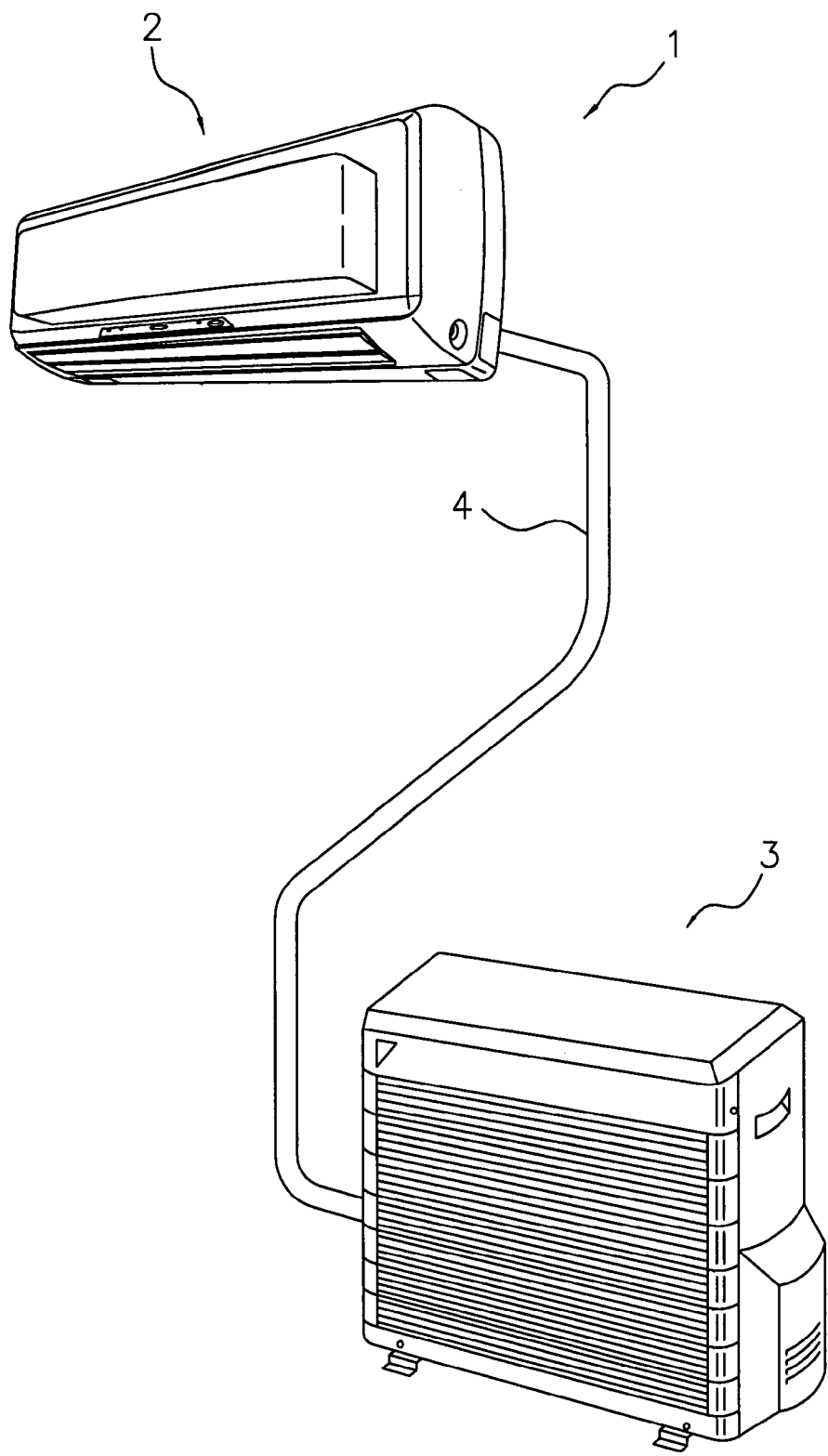
FIG. 1 is an external perspective view of an air conditioner pertaining to the present embodiment.

In FIG. 1, there is shown an external perspective view of an air conditioner 1 pertaining to the present embodiment.

The air conditioner 1 comprises a wall-mounted type indoor unit 2 that is attached to a wall surface inside a room and an outdoor unit 3 that is installed outdoors.

An indoor heat exchanger is housed inside the indoor unit 2, an outdoor heat exchanger is housed inside the outdoor unit 3, and the heat exchangers are interconnected by a refrigerant pipe 4 to configure a refrigerant circuit.

<Configural Schematics of Refrigerant Circuit of Air Conditioner>

Figure 2:
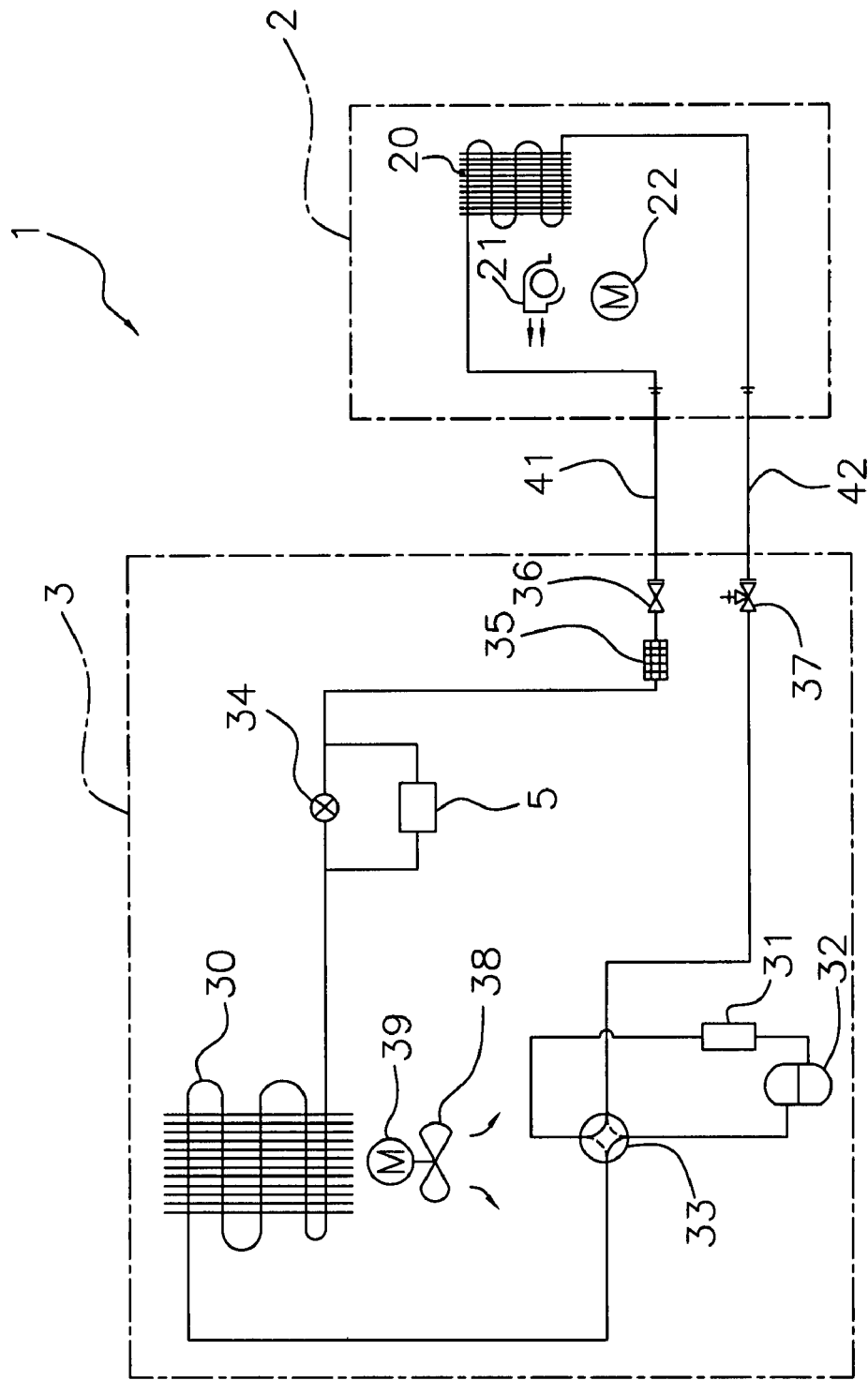
FIG. 2 is a diagram of a refrigerant circuit of the air conditioner pertaining to the present embodiment.

The configuration of the refrigerant circuit of the air conditioner 1 is shown in FIG. 2. The refrigerant circuit is primarily configured by an indoor heat exchanger 20, an accumulator 31, a compressor 32, a four-way switch valve 33, an outdoor heat exchanger 30, and an electric-operated expansion valve 34.

The indoor heat exchanger 20 disposed in the indoor unit 2 performs heat exchange with air coming into contact therewith. Further, a cross flow fan 21 for sucking in room air and discharging, into the room, air with respect to which heat exchange has been performed through the indoor heat exchanger 20 is disposed in the indoor unit 2. The cross flow fan 21 is configured in a circular cylinder shape, includes a peripheral surface on which blades are disposed in a rotational axis direction, and generates an air flow in a direction orthogonal to its rotational axis. The cross flow fan 21 is driven to rotate by an indoor fan motor 22 disposed inside the indoor unit 2.

Figure 3:
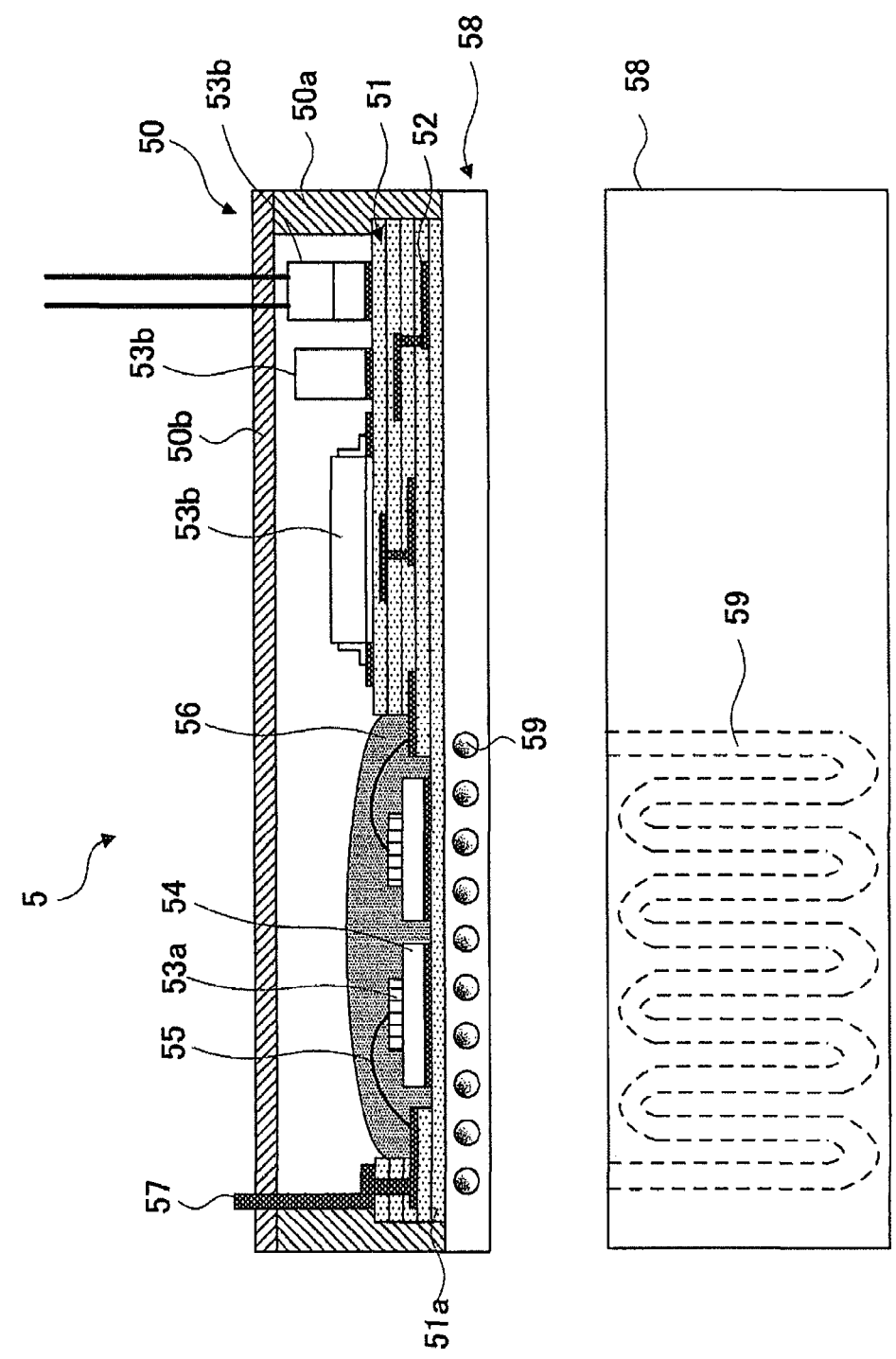
FIG. 3(a) is a longitudinal sectional view of a power module installed in the air conditioner pertaining to the present embodiment, and (b) is a top transparent view of a cooling jacket of the power module pertaining to the present embodiment.

Disposed in the outdoor unit 3 are the compressor 32, the four-way switch valve 33 connected to a discharge side of the compressor 32, the accumulator 31 connected to an intake side of the compressor 32, the outdoor heat exchanger 30 connected to the four-way switch valve 33, and the electric-operated expansion valve 34 connected to the outdoor heat exchanger 30. The electric-operated expansion valve 34 is connected to a pipe 41 via a filter 35 and a liquid close valve 36 and is connected to one end of the indoor heat exchanger 20 via the pipe 41. Further, the four-way switch valve 33 is connected to a pipe 42 via a gas close valve 37 and is connected to the other end of the indoor heat exchanger 20 via the pipe 42. The pipes 41 and 42 correspond to the refrigerant pipe 4 of FIG. 1. Further, a propeller fan 38 for discharging, to the outside, air after heat exchange by the outdoor heat exchanger 30 is disposed in the outdoor unit 3. The propeller fan 38 is driven to rotate by a fan motor 39. It will be noted that a cooling jacket 58 (see FIG. 3) disposed in a power module 5 (described later) that performs power conversion of the compressor 32, the fan motor 39, the electric-operated expansion valve 34 and the like is also connected to this refrigerant circuit.

<Configuration of Power Module>

In FIG. 3(a), there is shown a longitudinal sectional view of the power module 5 pertaining to the present embodiment.

The power module 5 pertaining to the present embodiment is primarily configured by a casing 50, a first electronic component 53a, a second electronic component 53b, a mounting substrate 51, and the cooling jacket 58.

The casing 50 is configured by a side wall 50a disposed upright on the mounting surface side of the electronic components 53a and 53b from the side edge of the mounting substrate 51 and by a cover 50b disposed so as to cover the upper portions of the electronic components 53a and 53b from the upper end of the side wall 50a.

The first electronic component 53a is a power semiconductor that generates a large amount of heat when it is powered (including a via chip and the like). In the present embodiment, "power semiconductor" refers to a diode, a power transistor, and the like, for example.

The second electronic component 53b is a non-power semiconductor and other electronic components (surface mounted components such as a condenser and a resistor). In the present embodiment, "non-power semiconductor" refers to a microcomputer, a ROM, and the like (including a via chip and the like) for example.

The mounting substrate 51 comprises an area (called a first mounting area below) on which the first electronic component 53a is mounted and an area (called a second mounting area below) on which the second electronic component 53b is mounted. The first mounting area is formed from a 1-ply sheet-like glass fiber reinforced epoxy resin (called "glass epoxy sheet" below) 51a, and the thickness thereof is around 100 μm. Incidentally, the thickness thereof is a value calculated in consideration of the amount of heat emitted from the first electronic component 53a being 40 W, the heat emission area being 4 cm$^2$, and keeping the first electronic component 53a at 100° C. or less (see FIG. 4). In this first mounting area, the first electronic component 53a is mounted on the 1-ply glass epoxy sheet 51a via a heat spreader 54 and a conductor, and is sealed by a sealant such as silicone gel 56. On the other hand, the second mounting area is formed from a laminate resin substrate where a conductor pattern 52 and the glass epoxy sheet 51a are alternately laminated. In this second mounting area, the second electronic component 53b is mounted on the laminate resin substrate, and the second electronic component 53b is connected to the conductor pattern 52 disposed between the glass epoxy sheets 51a to form a three-dimensional complex control circuit. It will be noted that the first electronic component 53a is also connected to the conductor pattern 52 via a wire 55, whereby part of a power supply circuit is formed. A lead 57 is used for connection to an external circuit. Incidentally, in order to form the mounting substrate 51 pertaining to the present embodiment, (i) a method of making thin the thickness of the first mounting area of the mounting substrate 51 by machining after adjusting a uniform plate-like laminated mounting substrate (it is necessary for the circuit pattern to be formed in consideration of machining) or (ii) a method of forming each ply of glass fiber fabric such that the mounting substrate becomes a predesigned shape, heating/compressing these after impregnating the $n^{th}$ layer of glass fiber fabric with an epoxy resin stock solution, thereafter forming a circuit pattern on both sides or one side thereof (This glass fiber reinforced epoxy resin is called circuit pattern holding glass epoxy sheet below.), thereafter interposing the glass fiber fabric of the $(n+1)^{th}$ layer impregnated with the epoxy resin stock solution between circuit pattern holding glass epoxy sheets and again heating/compressing the same are conceivable. In the latter case, a mold following the design shape becomes necessary.

The cooling jacket 58 is a rectangular parallelepiped metal box and is disposed on the opposite side of the mounting surface of the mounting substrate 51 on which the electronic components 53*a* and 53*b* are mounted, such that the cooling jacket 58 contacts the surface opposite the mounting surface of the mounting substrate 51. A cooling device or plural hairpin-shaped passages (called "refrigerant passages" below) 59 are formed inside the cooling jacket 58 in the portion corresponding to the first mounting area (see FIG. 3(*b*)). As shown in FIG. 2, the refrigerant passages 59 are connected to the refrigerant circuit so as to sandwich the electric-operated expansion valve 34. For this reason, liquid refrigerant flows into the refrigerant passages 59 from the refrigerant circuit so that primarily the heat arising from the first electronic component 53*a* is discharged from the power module 5 by that liquid refrigerant. It will be noted that the temperature of the liquid refrigerant flowing into the refrigerant circuit is ordinarily about 30 to 60° C.

<Method of Producing Power Module>

Here, the method of producing the power module 5 pertaining to the embodiment of the present invention will be described using FIG. 5.

Figure 5:
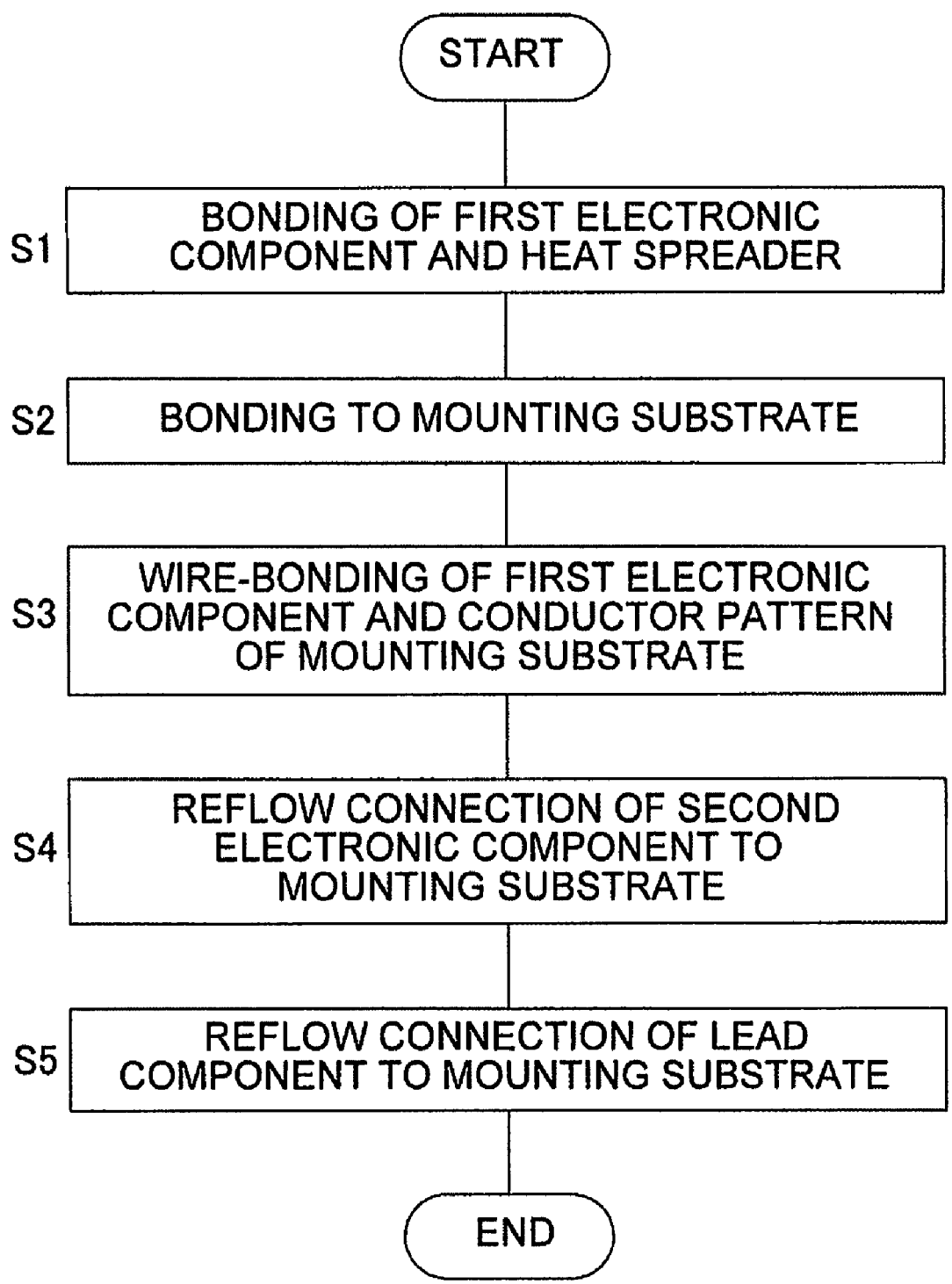
FIG. 5 is a flow chart showing the steps of producing the power module pertaining to the present embodiment.

Turning now to FIG. 5, in step S1, the first electronic component 53*a* and the heat spreader 54 are bonded. In step S2, the bonding product of the first electronic component 53*a* and the heat spreader 54 obtained in step S1 is bonded to the first mounting area of the mounting substrate 51. At this time, the bonding product is bonded such that the heat spreader 54 tightly contacts the mounting substrate 51. In step S3, the first electronic component 53*a* and the conductor pattern 52 of the mounting substrate 51 are bonded via a wire. In step S4, the second electronic component 53*b* is heated to a predetermined temperature in a state where it has been placed in a prescribed position on the conductor pattern 52, and the second electronic component 53*b* is soldered by reflow to the conductor pattern 52. It will be noted that a reflowable substance (cream solder, etc.) is printed on, or applied to, the conductor pattern 52 beforehand. In step S5, a lead component 53*c* (included in the second electronic component 53*b*) is soldered by a reflow method to the conductor pattern 52.

<Characteristics of Power Module>

(1)

In the power module 5 pertaining to the present embodiment, both the first electronic component 53*a* and the second electronic component 53*b* are mounted on the same mounting substrate 51 formed by glass fiber reinforced epoxy resin. For this reason, this power module 5 can be produced at a lower cost than conventional power modules that have been produced using separate mounting substrates for the first electronic component 53*a* and for the second electronic component 53*b*.

(2)

In the power module 5 pertaining to the present embodiment, the thickness of the first mounting area of the mounting substrate 51 is sufficiently thin so that the first electronic component 53*a* is effectively cooled by refrigerant of about 50° C. For this reason, this power module 5 can be produced at a lower cost than conventional power modules that have employed aluminium substrates and ceramic substrates for mounting the first electronic component 53*a*. Further, in this power module 5, workability is superior to that of the conventional power modules because the mounting substrate 51 is formed by glass fiber reinforced epoxy resin. Further, in this power module 5, the mounting reliability of the first electronic component 53*a* is superior to that of the conventional power modules because the mounting substrate 51 is formed by glass fiber reinforced epoxy resin.

(3)

In the power module 5 pertaining to the present embodiment, the shortest distance between the first electronic component 53*a* and the refrigerant passages 59 is shorter than the shortest distance between the second electronic component 53*b* and the refrigerant passages 59. For this reason, in this power module 5, the heat arising from the power semiconductor can be discharged to the outside of the power module 5 more efficiently than the heat arising from the second electronic component 53*b*.

<Modifications>

(A)

Figure 6:
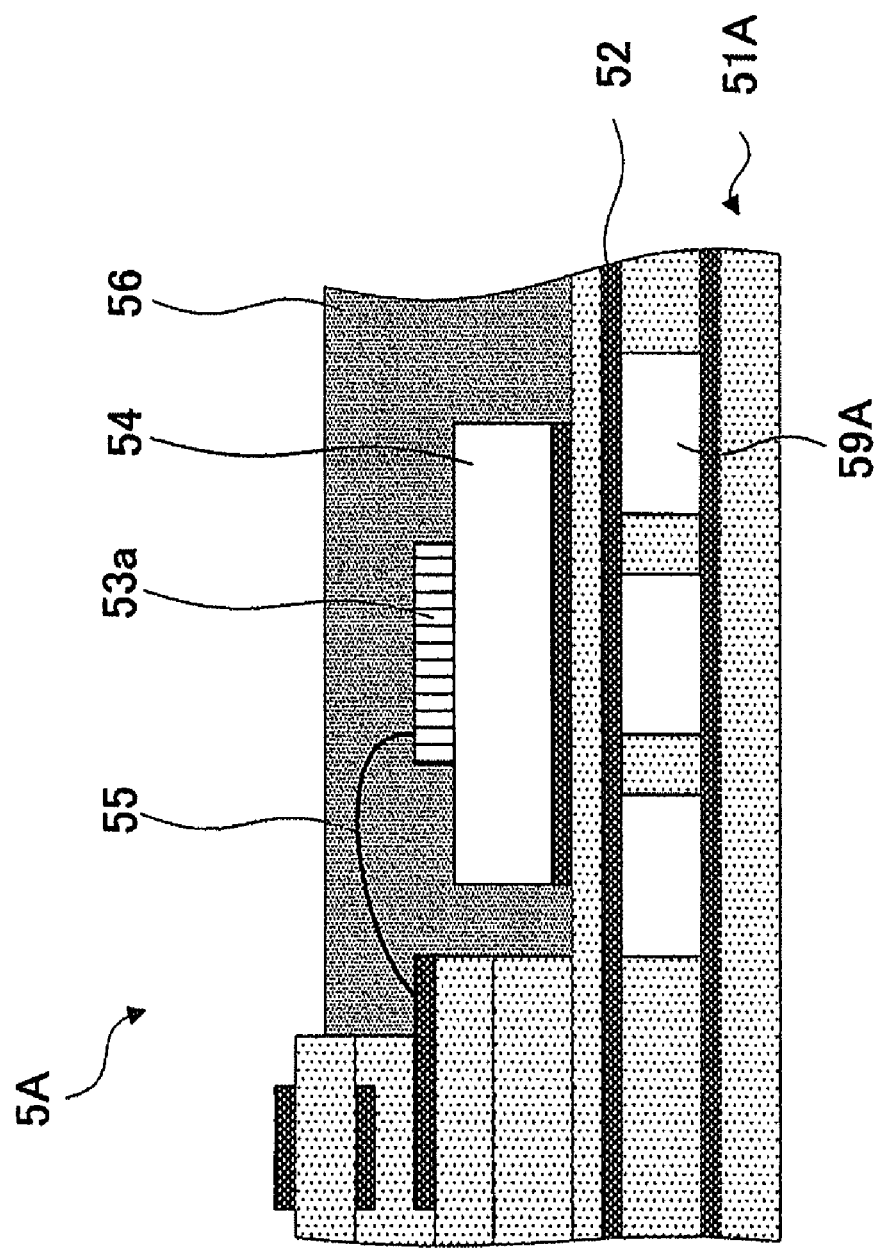
FIG. 6 is a partial longitudinal sectional view of a power module installed in an air conditioner pertaining to a modification (A).

In the power module 5 pertaining to the preceding embodiment, the cooling jacket 58 was disposed on the opposite side of the mounting surface of the mounting substrate 51 on which the electronic components 53*a* and 53*b* were mounted, such that the cooling jacket 58 contacted the surface opposite the mounting surface of the mounting substrate 51, and the cooling passages 59 were formed inside the cooling jacket 58. However, as shown in FIG. 6, a cooling device or cooling passages 59A may also be formed inside a mounting substrate 51A. By so doing, the distance between the first electronic component 53*a* and the cooling passages 59A can be shortened even more.

(B)

Figure 7:
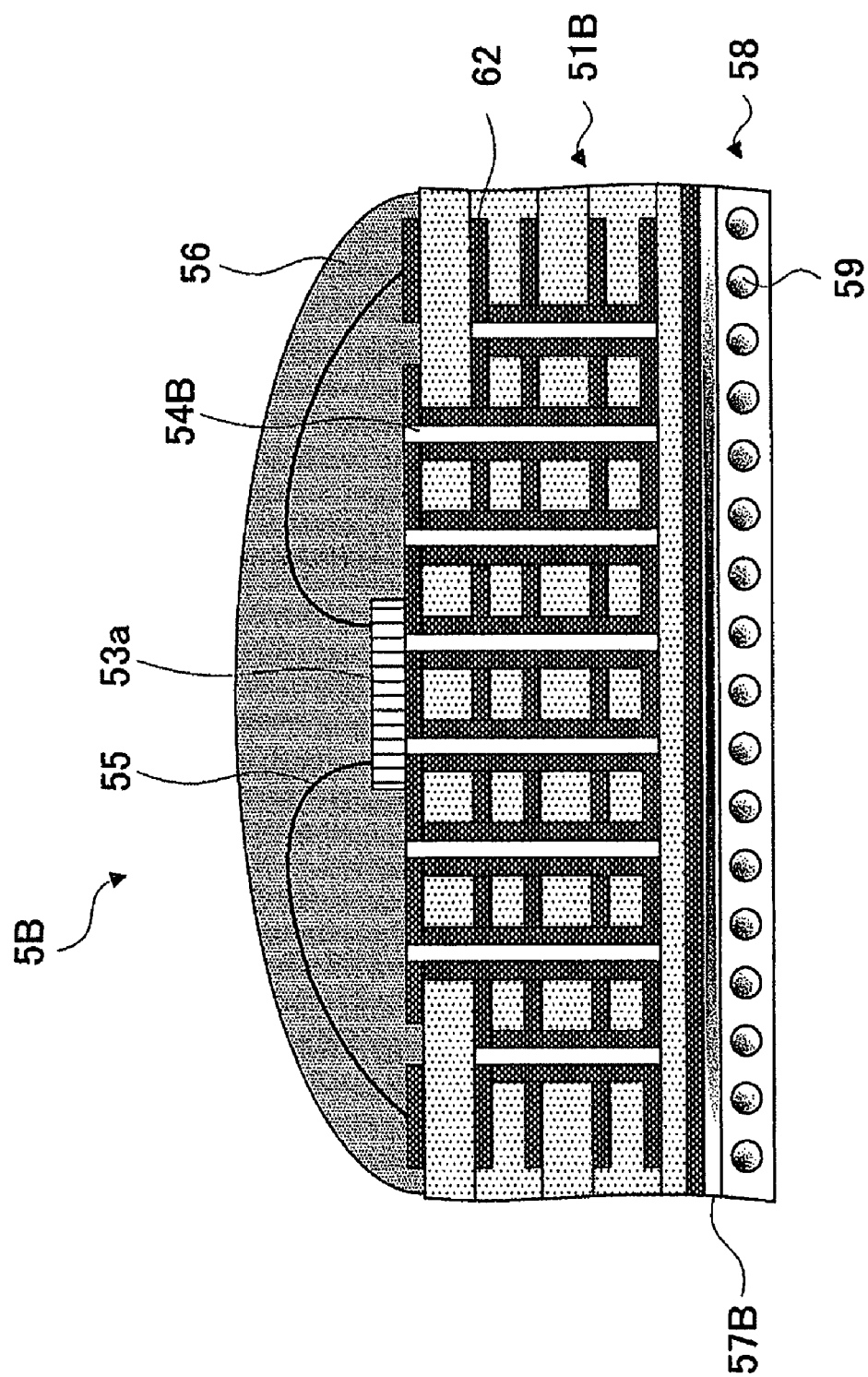
FIG. 7 is a partial longitudinal sectional view of a power module installed in an air conditioner pertaining to a modification (B).

In the power module 5 pertaining to the preceding embodiment, the thickness of the first mounting area of the mounting substrate 51 was thinner than the thickness of the second mounting area, but the thickness of the first mounting area may also be the same as the thickness of the second mounting area. In this case, as shown in the chart of FIG. 4, there is the potential for the heat arising from the first electronic component 53*a* to not be sufficiently discharged from the power module 5, so as shown in FIG. 7, it is preferable to dispose thermal through holes 54B inside a mounting substrate 51B around the first electronic component 53*a*. Moreover, a contact heat transfer layer 57B may also be disposed between the cooling jacket 58 and the mounting substrate 51B. Furthermore, a heat spreader may be inserted between the first electronic component 53*a* and the mounting substrate 51B.

(C)

In the power module 5 pertaining to the preceding embodiment, the temperature of the refrigerant flowing into the refrigerant passages 59 was virtually determined by the flow of the refrigeration cycle. However, a temperature sensor may be disposed in the vicinity of the first electronic component 53*a*, an expansion valve may be disposed in the vicinity of the gateway of the refrigerant passages 59, and the evaporation temperature of the refrigerant may be controlled to maintain the temperature in the vicinity of the first electronic component 53a at a constant. By so doing, the first electronic component can be more reliably protected. In this case, the outlet of the refrigerant passages 59 may be connected to the intake pipe of the compressor 32.

(D)

In the power module 5 pertaining to the preceding embodiment, the thickness of the first mounting area of the mounting substrate 51 was set to around 100 μm, but the first mounting area may also be thicker than that depending on the temperature of refrigerant flowing into the refrigerant passages 59 (see FIG. 4). Conversely, the thickness of the first mounting area of the mounting substrate 51 may also be less than 100 μm, but in this case, it is necessary to consider dielectric breakdown strength.

(E)

In the power module 5 pertaining to the preceding embodiment, an epoxy resin was employed as the raw material of the mounting substrate 51, but an epoxy resin in which ceramic powder or the like having an insulating property are mixed may also be employed. By so doing, the thermal conductivity of the mounting substrate can be improved, and the heat arising from the first electronic component 53a can be efficiently discharged to the outside of the power module 5.

(F)

Figure 8:
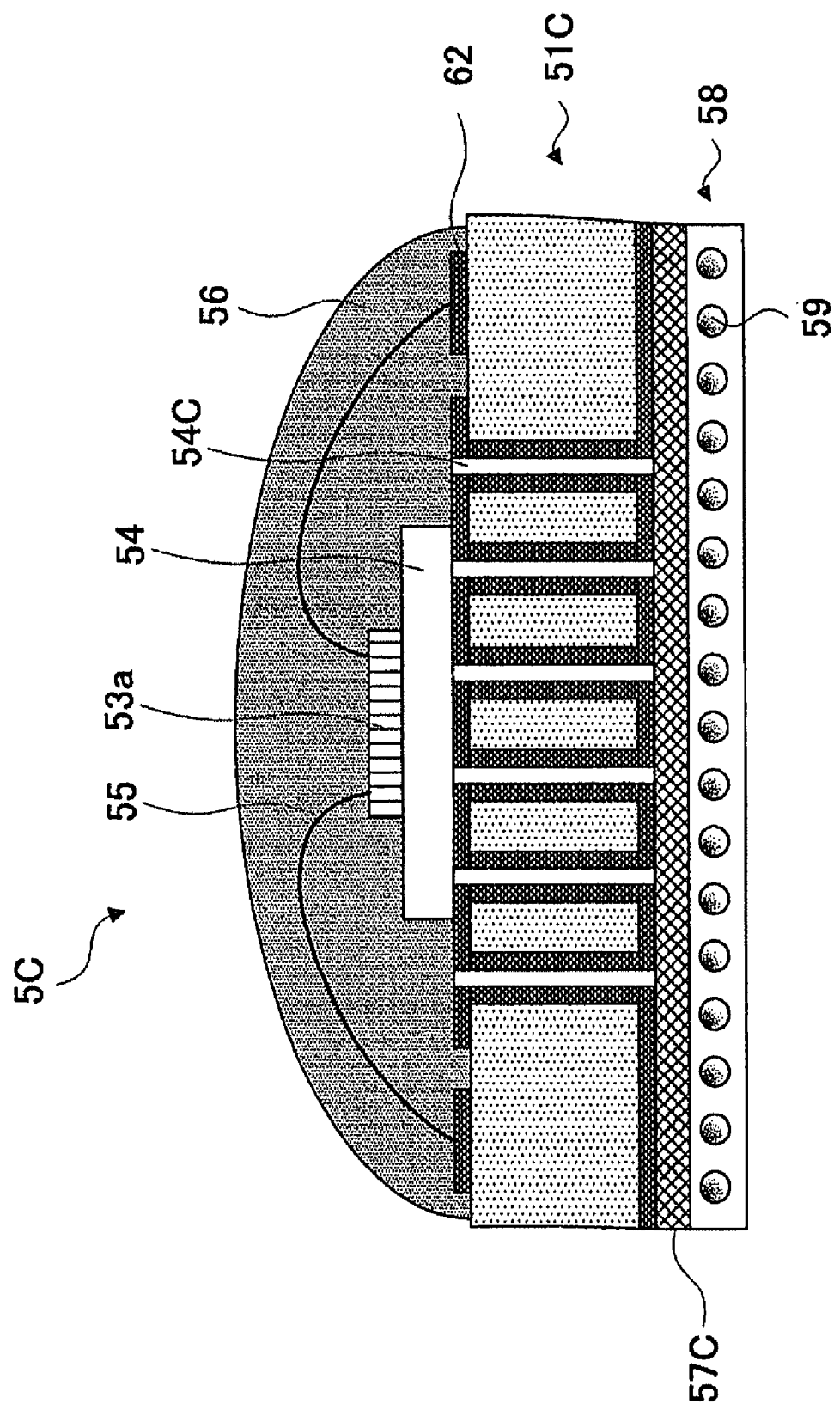
FIG. 8 is a partial longitudinal sectional view of a power module installed in an air conditioner pertaining to a modification (F).
Figure 9:
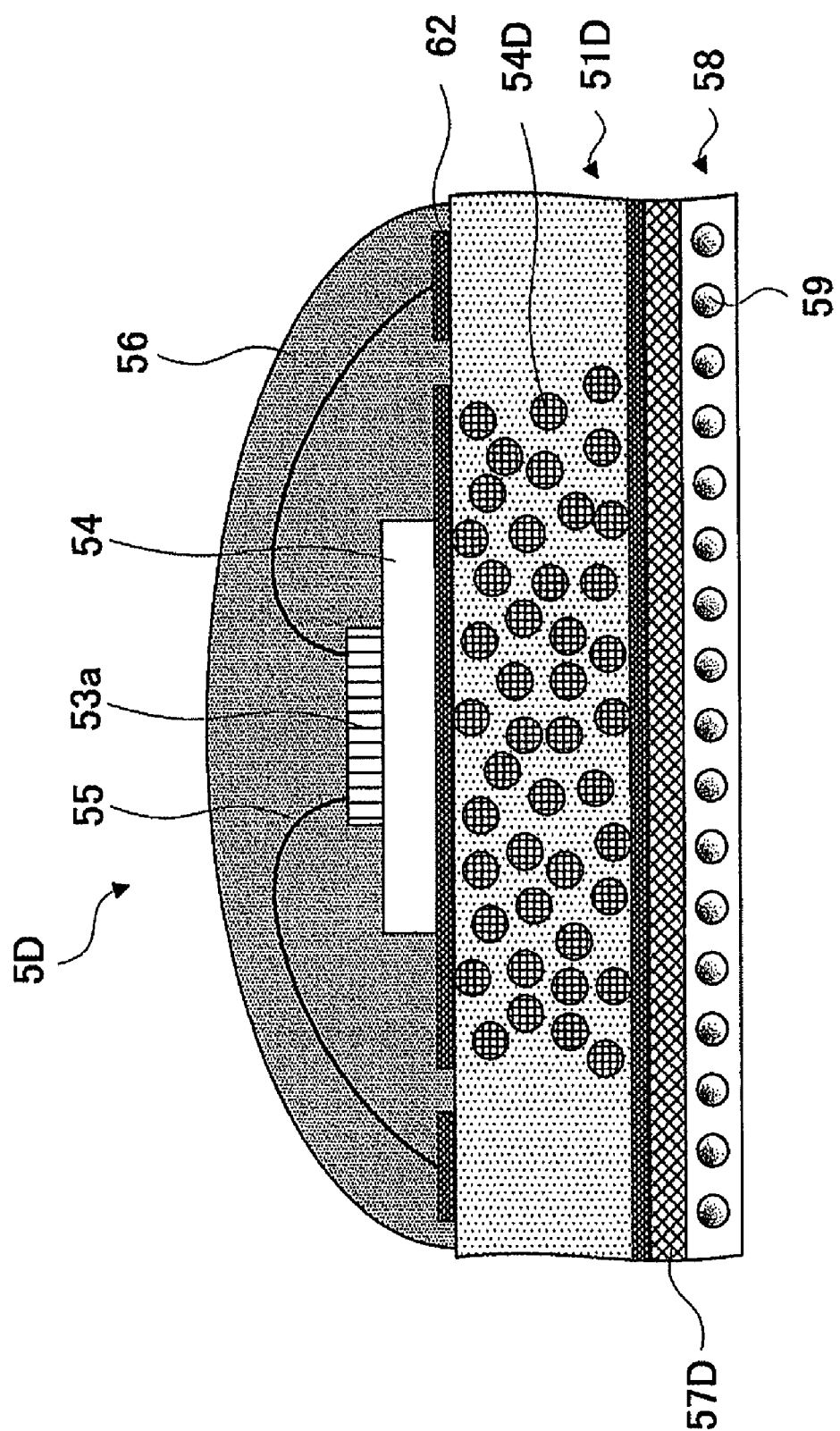
FIG. 9 is a partial longitudinal sectional view of a power module installed in an air conditioner pertaining to a modification (F).
Figure 10:
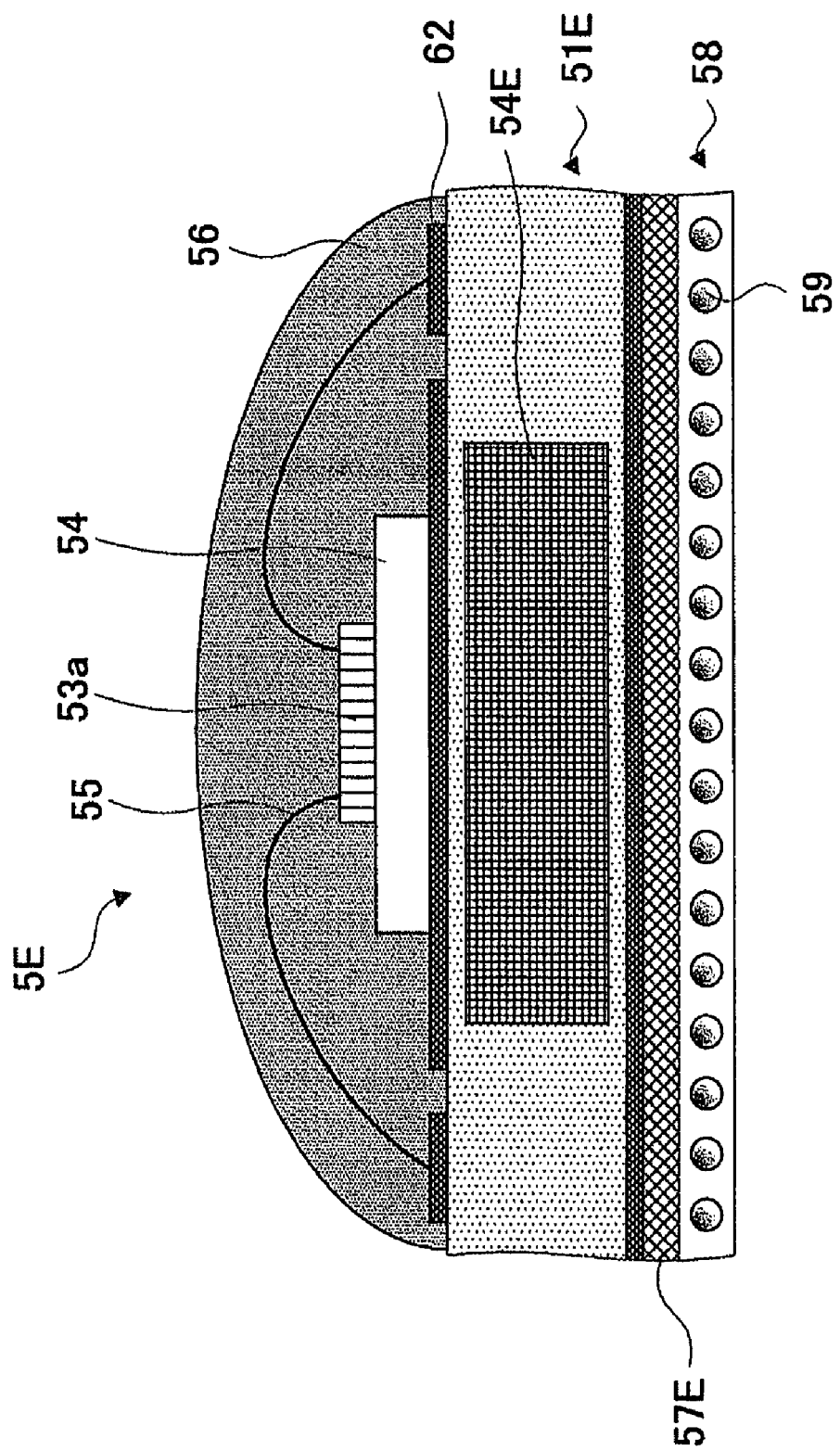
FIG. 10 is a partial longitudinal sectional view of a power module installed in an air conditioner pertaining to a modification (F).

In the power module 5 pertaining to the preceding embodiment, a laminate resin substrate was employed as the mounting substrate 51, but instead of this, as shown in FIG. 8, FIG. 9, and FIG. 10, two-sided resin substrates 51C, 51D, 51E on just both sides of which a conductor pattern is disposed may also be employed. In such power modules 5C, 5D, and 5E, it is preferable to dispose thermal through holes 54C in the resin portions of the two-sided resin substrates 51C, 51D, and 51E in order to cause the heat arising from the first electronic component 53a to be diffused in the direction of the refrigerant passages 59, or to disperse a thermally conductive filler 54D in the resin portion, or to insert a thermally conductive sheet 54E into the resin portion. Further, it is even more effective to dispose the heat spreader 54 that causes the heat arising from the first electronic component 53a to be diffused along the mounting surface. In this case, it is preferable to dispose electrical insulation layers 57C, 57D, and 57E between the two-sided resin substrates 51C, 51D, and 51E and the cooling jacket 58 in order to ensure the insulating property of the two-sided resin substrates 51C, 51D, and 51E. However, when the thermally conductive filler 54D and the thermally conductive sheet 54E is made from a ceramic or the like and have an electrical insulation property, the electrical insulation layers 57C, 57D, and 57E can be omitted.

(G)

Figure 11:
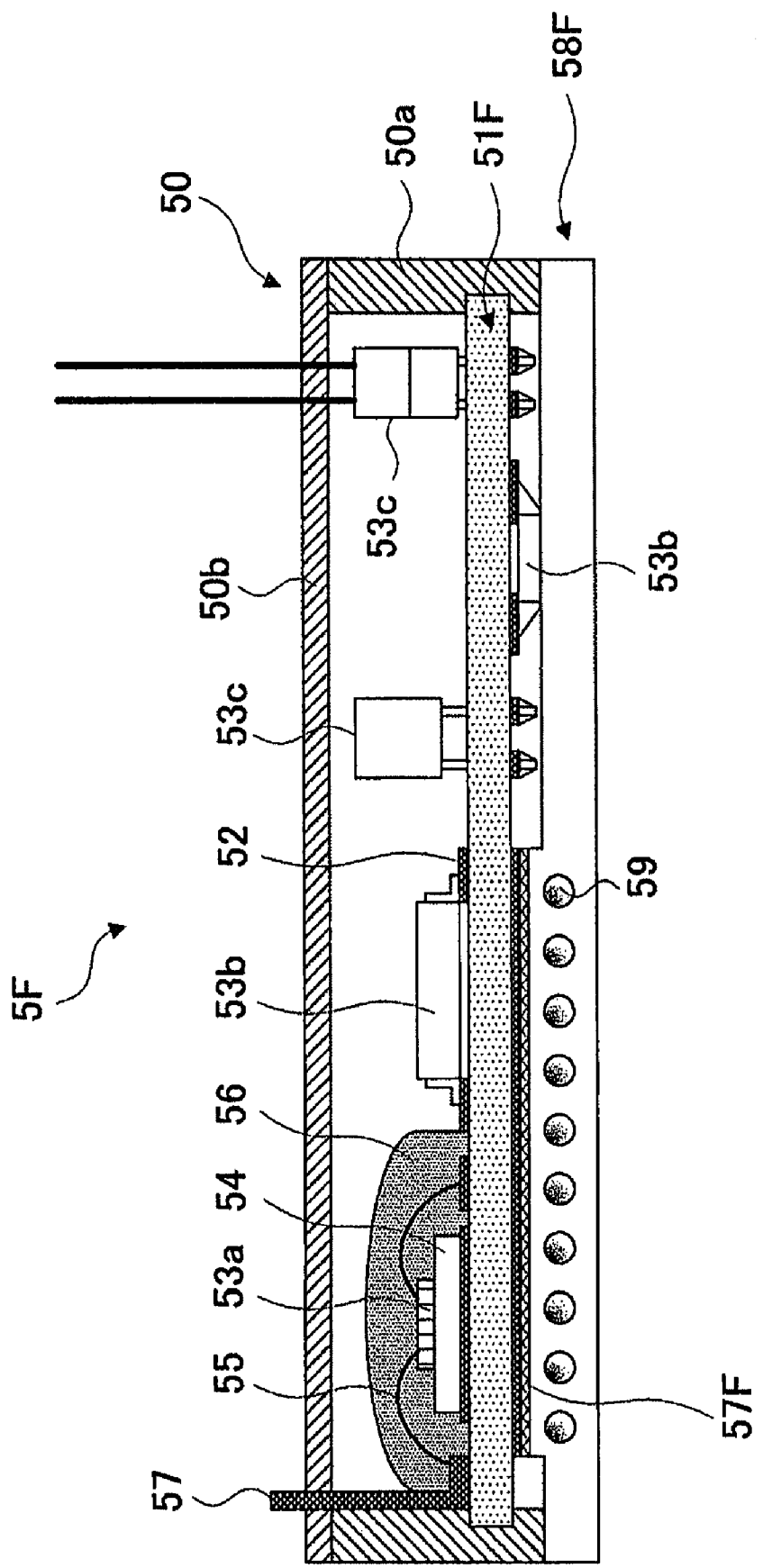
FIG. 11 is a partial longitudinal sectional view of a power module installed in an air conditioner pertaining to a modification (G).

In the power module 5 pertaining to the preceding embodiment, the cooling jacket 58 was employed whose surface contacting the mounting substrate 51 had a flat shape, but instead of this, a stepped cooling jacket 58F as shown in FIG. 11 may also be employed. By so doing, the cooling jacket 58F contacts just the surface on the opposite side of the mounting surface on which the first electronic component 53a and the like are mounted, and it becomes possible to perform two-sided mounting at the other portion. Consequently, in such a power module 5F, unnecessary cooling (or heating) can be prevented, and at the same time further compactification becomes possible. Further, by so doing, it also becomes possible to accommodate instances where lead wires emerge from the surface on the opposite side of the mounting surface.

Further, an electrical insulation layer 57F may also be disposed between the cooling jacket 58F and the mounting substrate 51F.

(H)

In the method of producing the power module 5 pertaining to the preceding embodiment, each process was performed in the order of step S1, step S2, step S3, step S4, and step S5, but this order may be switched around. For example, each process may be performed in the order of step S1, step S4, step S2, step S3, and step S5, or each process may be performed in the order of step S1, step S2, step S4, step S3, and step S5, or each process may be performed in the order of step S5, step S1, step S2, step S3, and step S4.

(I)

In the power module 5 pertaining to the preceding embodiment, an epoxy resin was employed as the raw material of the mounting substrate 51, but a resin other than this (e.g., a phenol resin, a bismaleimide resin, a polyimide resin) may also be employed.

INDUSTRIAL APPLICABILITY

The power module pertaining to the present invention has the characteristic that it can be produced at a lower production cost than conventional power modules and can contribute to reducing the cost of power modules.

What is claimed is:

1. A power module comprising:
a power semiconductor device and a non-power semiconductor device configuring a power supply circuit to perform power conversion;
a resin substrate, both the power semiconductor device and the non-power semiconductor device being mounted on the resin substrate; and
a cooling device being configured to cool the power semiconductor device, the cooling device including a cooling fluid passage disposed on a side opposite a mounting surface of the resin substrate, the power semiconductor device and the non-power semiconductor device being mounted on the mounting surface of the resin substrate, the cooling fluid passage allowing a cooling fluid to cool the power semiconductor device to pass therethrough,
a shortest distance between the power semiconductor device and the cooling fluid passage being shorter than a shortest distance between the non-power semiconductor device and the cooling fluid passage.

2. The power module of claim 1, wherein
the cooling fluid passage is disposed inside the resin substrate.

3. The power module of claim 1, further comprising
a temperature detector that detects the temperature of the power semiconductor device or the vicinity thereof, and
a temperature controller that controls the temperature of the cooling fluid such that the temperature detected by the temperature detector becomes a predetermined temperature.

4. A power module comprising:
a power semiconductor device and a non-power semiconductor device configuring a power supply circuit to perform power conversion;
a resin substrate, both the power semiconductor device and the non-power semiconductor device being mounted on the resin substrate, a thickness of a portion of the resin substrate on which the power semiconductor device is mounted being thinner than a thickness of a portion of the resin substrate on which the non-power semiconductor device is mounted; and a cooling device being configured to cool the power semiconductor device.

5. The power module of claim 1, wherein
the resin substrate is configured by a plurality of laminate units laminated in a board thickness direction, and
a thickness of a portion on which the power semiconductor device is mounted and a thickness of a portion on which the non-power semiconductor device is mounted are adjusted depending on shapes of the laminate units.

6. The power module of any of claim 1, further comprising a heat diffusing portion that diffuses heat arising from at least the power semiconductor device.

7. The power module of claim 6, further comprising
an electrical insulation layer disposed between the heat diffusing portion and the cooling fluid passage.

8. The power module of claim 6, wherein
a heat spreader disposed between the power semiconductor device and the mounting surface of the resin substrate is included in the heat diffusing portion.

9. The power module of claim 6, wherein
a thermal through hole disposed inside the resin substrate along a direction intersecting a board surface of the resin substrate is included in the heat diffusing portion.

10. The power module of claim 6, wherein
a thermally conductive filler dispersed and mixed in with a resin portion of the resin substrate is included in the heat diffusing portion.

11. The power module of claim 3, wherein
a thermally conductive sheet embedded in a resin portion of the resin substrate is included in the heat diffusing portion.

12. A power module comprising:
a power semiconductor device and a non-power semiconductor device configuring a power supply circuit to perform power conversion;
a mounting substrate, both the power semiconductor device and the non-power semiconductor device being mounted on the mounting substrate, the mounting substrate having a thermal conductivity in a board thickness direction that is 10 W/(m·K) or less; and
a cooling device being configured to cool the power semiconductor device, the cooling device including a cooling fluid passage disposed on a side opposite a mounting surface of the mounting substrate, the power semiconductor device and the non-power semiconductor device being mounted on the mounting surface of the mounting substrate, the cooling fluid passage allowing a cooling fluid to cool the power semiconductor device to pass therethrough,
a shortest distance between the power semiconductor device and the cooling fluid passage being shorter than a shortest distance between the non-power semiconductor device and the cooling fluid passage.

13. An air conditioner comprising:
a refrigerant circuit; and
a power module including
a power semiconductor device and a non-power semiconductor device configuring a power supply circuit to perform power conversion,
a resin substrate, both the power semiconductor device and the non-power semiconductor device being mounted on the resin substrate, and
a refrigerant passage being disposed on a side opposite a mounting surface of the resin substrate, the power semiconductor device and the non-power semiconductor device being mounted on the mounting surface, the refrigerant passage allowing refrigerant flowing in the refrigerant circuit to pass therethrough,
a shortest distance between the power semiconductor device and the refrigerant passage being shorter than a shortest distance between the non-power semiconductor device and the refrigerant passage.

14. A method of producing a power module comprising:
fixing a power semiconductor device and a non-power semiconductor device to prescribed positions on a resin substrate;
connecting the power semiconductor device and a circuit disposed on the resin substrate;
connecting the non-power semiconductor device and the circuit; and
fixing the resin substrate to a cooling device such that a shortest distance between the power semiconductor device and a cooling fluid passage of the cooling device being shorter than a shortest distance between the non-power semiconductor device and the cooling fluid passage.

15. The power module of claim 6, wherein
a thermally conductive sheet embedded in a resin portion of the resin substrate is included in the heat diffusing portion.

16. The power module of any of claim 1, further comprising
a heat diffusing portion for diffusing heat arising from at least the power semiconductor device.

17. A power module comprising:
a power semiconductor device and a non-power semiconductor device configuring a power supply circuit to perform power conversion;
a mounting substrate, both the power semiconductor device and the non-power semiconductor device being mounted on the mounting substrate, the mounting substrate having a thermal conductivity in a board thickness direction that is 10 W/(m·K) or less, a thickness of a portion of the mounting substrate on which the power semiconductor device is mounted being thinner than a thickness of a portion of the mounting substrate on which the non-power semiconductor device is mounted; and
a cooling device being configured to cool the power semiconductor device.

18. An air conditioner comprising:
a refrigerant circuit; and
a power module including
a power semiconductor device and a non-power semiconductor device configuring a power supply circuit to perform power conversion,
a resin substrate, both the power semiconductor device and the non-power semiconductor device being mounted on the resin substrate, a thickness of a portion of the resin substrate on which the power semiconductor device is mounted being thinner than a thickness of a portion of the resin substrate on which the non-power semiconductor device is mounted, and
a refrigerant passage being disposed on a side opposite a mounting surface of the resin substrate, the power semiconductor device and the non-power semiconductor device being mounted on the mounting surface, the refrigerant passage allowing refrigerant flowing in the refrigerant circuit to pass therethrough.

19. A method of producing a power module comprising:

fixing a power semiconductor device and a non-power semiconductor device to prescribed positions on a resin substrate such that a thickness of a portion of the resin substrate on which the power semiconductor device is mounted is thinner than a thickness of a portion of the resin substrate on which the non-pow semiconductor device is mounted;

connecting the power semiconductor device and a circuit disposed on the resin substrate;

connecting the non-power semiconductor device and the circuit; and fixing the resin substrate to a cooling device.

20. A power module comprising:

a power semiconductor device and a non-power semiconductor device configuring a power supply circuit to perform power conversion;

a resin substrate, both the power semiconductor device and the non-power semiconductor device being mounted on a mounting surface on a portion of the resin substrate; and a stepped cooling device contacting the portion of the resin substrate, and contacting only a surface on a side opposite the mounting surface of the portion of the resin substrate on which at least the power semiconductor is mounted.

* * * * *